United States Patent
Cheng et al.

(10) Patent No.: US 12,382,708 B2
(45) Date of Patent: Aug. 5, 2025

(54) VERTICAL STACKED NANOSHEET CMOS TRANSISTORS WITH DIFFERENT WORK FUNCTION METALS

(71) Applicant: International Business Machines Corporation, Armonk, NY (US)

(72) Inventors: Kangguo Cheng, Schenectady, NY (US); Juntao Li, Cohoes, NY (US); Ruilong Xie, Niskayuna, NY (US); Chanro Park, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 266 days.

(21) Appl. No.: 17/497,173

(22) Filed: Oct. 8, 2021

(65) Prior Publication Data

US 2022/0044973 A1    Feb. 10, 2022

Related U.S. Application Data

(62) Division of application No. 16/354,570, filed on Mar. 15, 2019, now Pat. No. 11,158,544.

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02532* (2013.01); *H01L 21/02603* (2013.01); *H01L 21/28088* (2013.01); *H10D 30/031* (2025.01); *H10D 30/6713* (2025.01); *H10D 30/6735* (2025.01); *H10D 30/6739* (2025.01); *H10D 30/6757* (2025.01); *H10D 62/121* (2025.01); *H10D 64/017* (2025.01);
(Continued)

(58) Field of Classification Search
CPC ......... H01L 21/02532; H01L 21/02603; H01L 21/28088; H01L 21/8221
See application file for complete search history.

(56) References Cited

U.S. PATENT DOCUMENTS 6,649,980 B2    11/2003  Noguchi
8,044,442 B2    10/2011  Kam et al.
(Continued)

OTHER PUBLICATIONS

List of IBM Patents or Patent Applications Treated as Related.

*Primary Examiner* — Tony Tran
(74) *Attorney, Agent, or Firm* — Samuel A. Waldbaum

(57) ABSTRACT

A method for forming a semiconductor device includes forming a structure having at least a first nanosheet stack for a first device, a second nanosheet stack for a second device and disposed over the first nanosheet stack, a disposable gate structure, and a gate spacer. The disposable gate structure and sacrificial layers of the first and second nanosheet stacks are removed thereby forming a plurality of cavities. A conformal gate dielectric layer is formed in the plurality cavities and surrounding at least portions of the first and second nanosheet stacks. A first conformal work function layer is formed in contact with the gate dielectric layer. Portions of the first conformal work function layer are removed without using a mask from at least the second nanosheet stack. A second conformal work function layer is formed on exposed portions of the gate dielectric layer.

6 Claims, 12 Drawing Sheets

(51) Int. Cl.
  *H01L 21/28* (2006.01)
  *H10D 30/01* (2025.01)
  *H10D 30/67* (2025.01)
  *H10D 62/10* (2025.01)
  *H10D 64/01* (2025.01)
  *H10D 64/66* (2025.01)
  *H10D 84/01* (2025.01)
  *H10D 84/85* (2025.01)

(52) U.S. Cl.
  CPC ....... *H10D 64/667* (2025.01); *H10D 84/0167* (2025.01); *H10D 84/017* (2025.01); *H10D 84/0177* (2025.01); *H10D 84/85* (2025.01)

(56) References Cited

U.S. PATENT DOCUMENTS

| | | |
|---|---|---|
| 9,224,811 B2 | 12/2015 | Cheng et al. |
| 9,935,014 B1 | 4/2018 | Cheng et al. |
| 9,997,519 B1 | 6/2018 | Bao et al. |
| 9,997,618 B2 | 6/2018 | Cheng et al. |
| 2017/0148922 A1* | 5/2017 | Hatcher ............. H01L 27/1203 |
| 2017/0179128 A1* | 6/2017 | Balakrishnan ............................. H01L 21/823807 |
| 2018/0277628 A1 | 9/2018 | Bi et al. |
| 2019/0131394 A1* | 5/2019 | Reznicek .......... H01L 21/30604 |
| 2020/0294866 A1 | 9/2020 | Cheng et al. |

\* cited by examiner

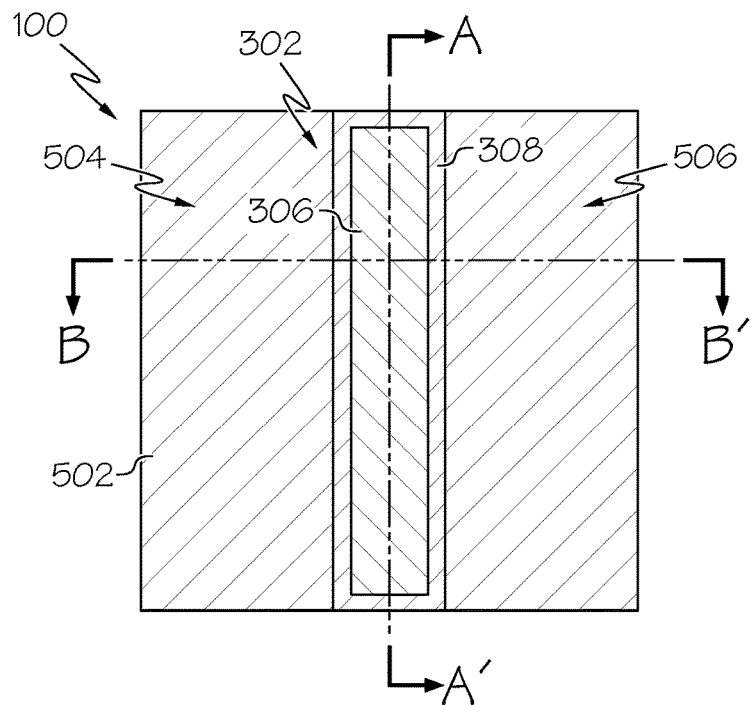
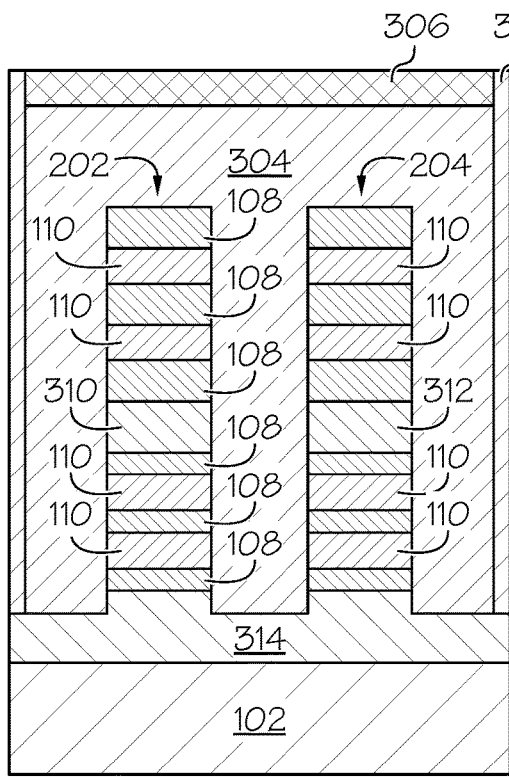
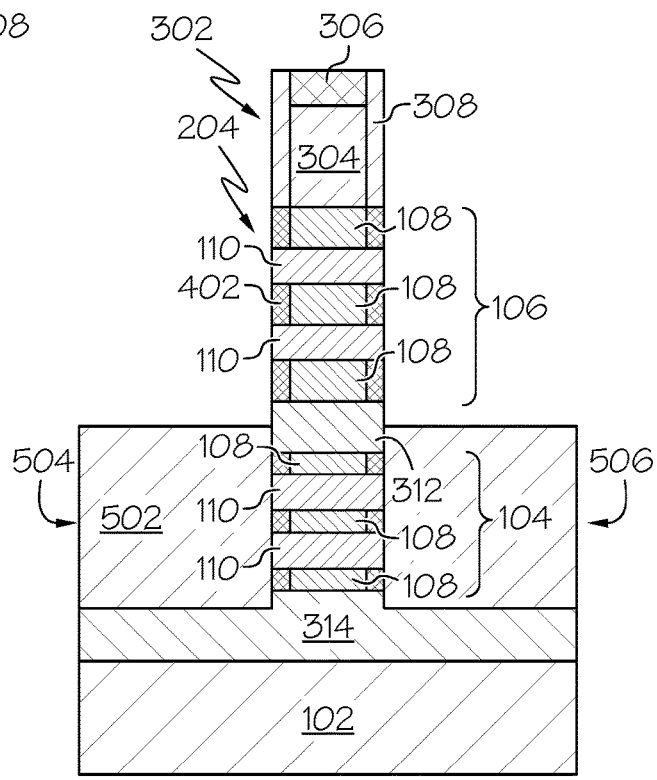
FIG. 5
FIG. 5A
FIG. 5B

VERTICAL STACKED NANOSHEET CMOS TRANSISTORS WITH DIFFERENT WORK FUNCTION METALS

BACKGROUND OF THE INVENTION

The present invention generally relates to metal-oxide-semiconductor field-effect transistors (MOSFET), and more particular relates to nanosheet transistors.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

As semiconductor devices scale to smaller dimensions, nanosheet (nanowire) devices provide advantages. Stacked nanowires provide area efficiency. Stacked nanowires provide, for example, increased drive current within a given layout area

SUMMARY OF THE INVENTION

In one embodiment, a method for forming a semiconductor device comprises forming a structure. The structure comprises at least a first nanosheet stack including a first set of alternating nanosheet and sacrificial layers for a first device, a second nanosheet stack disposed over the first nanosheet stack and including a second set of alternating nanosheet and sacrificial layers for a second device, a disposable gate structure formed in contact with the second nanosheet stack, and a gate spacer wrapping the gate structure. The disposable gate structure and sacrificial layers of the first and second nanosheet stacks are removed thereby forming a plurality of cavities. A conformal gate dielectric layer is formed in the plurality of cavities and surrounding at least portions of each nanosheet layer of the first and second nanosheet stacks. A first conformal work function layer is formed in contact with the gate dielectric layer. Portions of the first conformal work function layer are removed (without using a mask) from at least the second nanosheet stack and sidewalls of the first nanosheet stack. A second conformal work function layer is formed on exposed portions of the gate dielectric layer. A gate conductive layer is formed in contact with the second conformal work function layer.

In another embodiment, a method forming a semiconductor structure comprises forming a first insulating layer having a first concentration of germanium on a substrate. A first set of alternating sacrificial and nanosheet layers is epitaxially grown. The first set of alternating sacrificial layers has a second concentration of germanium. A second insulating layer having the first concentration of germanium is formed on and in contact with a top surface of the first nanosheet stack. A second nanosheet stack comprising a second set of alternating sacrificial and nanosheet layers is epitaxially grown. The second set of alternating sacrificial layers has the second concentration of germanium and a thickness that is greater than a thickness of the first set of sacrificial layers.

In a further embodiment, a semiconductor device comprises a first nanosheet stack for a first device and a second nanosheet stack for a second device. The second nanosheet stack is disposed on top of the first nanosheet stack. The semiconductor device further comprises a gate structure wrapping around the first nanosheet stack and the second nanosheet stack. The gate structure comprises a gate dielectric layer, a first work function layer, a second work function layer, and a gate conductor layer. The gate dielectric layer surrounds a first set of nanosheet layers of the first nanosheet stack and a second set of nanosheet layers of the second nanosheet stack. The first work function layer contacts at least a first portion of the gate dielectric layer surrounding the first set of nanosheet layers and is pinched off between each nanosheet layer of the first set of nanosheet layers. The second work function layer contacts at least second portion of the gate dielectric layer surrounding the second set of nanosheet layers. A gap exists between portions of the second work function layer between each nanosheet layer of the second set of nanosheet layers. The gate conductor layer is formed in contact with the second work function layer and fills the gap between the portions of the second work function layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the embodiments of the invention, in which:

FIG. 5 is a planar view of the semiconductor structure after source/drains have been formed for the nFET device according one example of the present invention;

FIG. 5A is a view of the structure shown in FIG. 5 taken transverse to the long axis of the nanosheet stacks according one example of the present invention;

FIG. 5B is a cross-section view of the structure shown in FIG. 5 taken along a line that passes through a nanosheet stack according one example of the present invention;

DETAILED DESCRIPTION

Figure 1:
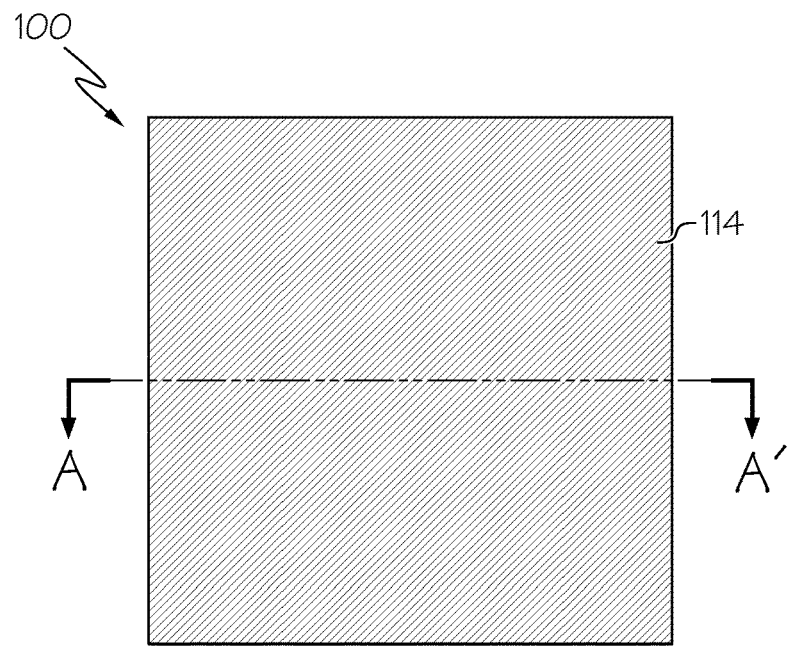
FIG. 1 is a planar view of a semiconductor structure comprising stacked nFET and pFET sacrificial and nanosheet layers according one example of the present invention.

It is to be understood that the various layers and/or regions shown in the accompanying drawings are not drawn to scale, and that one or more layers and/or regions of a type commonly used in metal-oxide semiconductor (MOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral", "lateral side", and "lateral surface" refer to a side surface of an element (e.g., a layer, opening, etc.), such as a left or right side surface in the cross-sectional views herein.

Various embodiments will now be discussed in further detail with regard to semiconductor devices and methods of manufacturing the same and, in particular, to a fabrication method and structure of a stack nanosheet-based semiconductor device with different work function metals utilizing a mask-free process. Nanosheets are a viable device option as CMOS technology continues to scale. Conventional nanosheet CMOS structures have a nFET and a pFET side by side, which consumes a relatively large device footprint. The use of vertical stacked nanosheets may overcome this problem. However, forming p-type work function metal in the pFET region and a n-type work function metal in the nFET device region is challenging due to the vertical stacked structure. Removing work function metal between closely spaced nanosheets is non-trivial. Embodiments of the present invention overcome these problems by providing a method for forming vertically stacked n-type and p-type nanosheet transistors to improve transistor density in unit chip area and improved the device isolations. In addition, embodiments form/deposit p-type work function metal in the pFET device region and n-type work function metal in the nFET device region with no additional mask or cost.

Figure 1A:
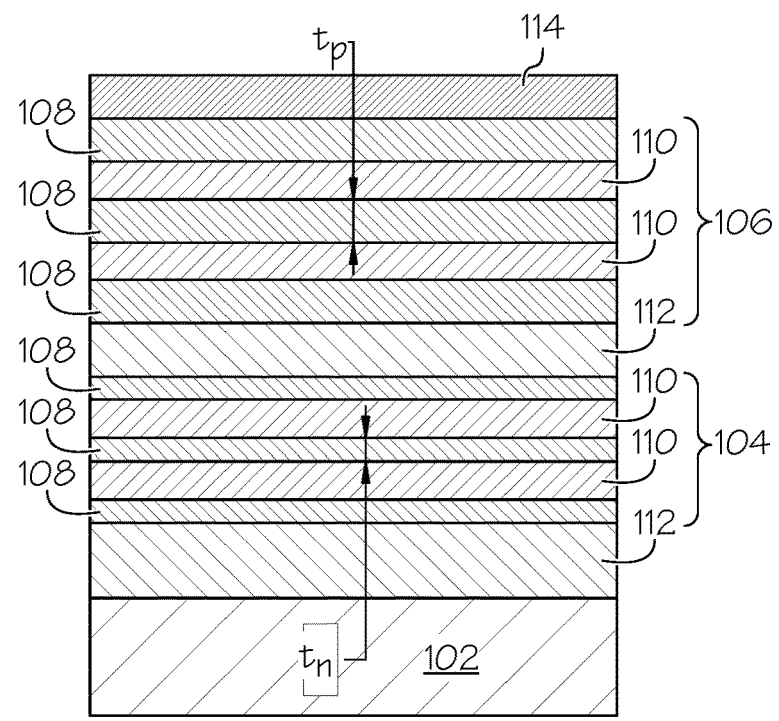
FIG. 1A is a cross-sectional view of the structure shown in FIG. 1 according one example of the present invention.

Referring now to the drawings in which like numerals represent the same or similar elements, FIGS. 1 and 1A show a semiconductor structure 100 comprising a handle substrate 102. The handle substrate 102, in one embodiment, may be a bulk substrate comprising silicon (Si). However, the substrate 102 may include materials other than or in addition to silicon. For example, the substrate 102 may include a semiconductor material including, but not necessarily limited to, silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, multiple layers of the semiconductor materials may be used as the semiconductor material of the substrate. In some embodiments, the substrate 102 includes both semiconductor materials and dielectric materials. The semiconductor substrate 102 may also comprise an organic semiconductor or a layered semiconductor such as, for example, Si/SiGe, a silicon-on-insulator or a SiGe-on-insulator. The semiconductor substrate 102 may be doped, undoped or contain doped regions and undoped regions therein. The semiconductor substrate 102 may contain have with strain and regions without strain therein, or have regions of tensile strain and compressive strain.

The structure 100 further comprises a bottom device stack 104 and a top device stack 106 disposed directly above the bottom device stack 104. In one example, the bottom device stack 104 may be referred to as the "nFET device stack 104" and the top device stack 104 may be referred to as the "pFET device stack 106). It should be noted that embodiments of the present invention are not limited to a pFET device stack being formed on top of a nFET device stack. For example, other embodiments have pFET device stack on the bottom and a nFET device stack formed on top of the pFET device stack. In another example, there may be a first nFET device stack formed on the bottom and a second nFET device stack formed on top of the first nFET device stack. In this example, different work function layers (discussed below) are formed for each of the nFET device stacks.

The stacks 104, 106 may be formed by epitaxially growing alternating sacrificial layers 108 and nanosheet (channel) layers 110 on an insulating layer 112. In one example, the sacrificial layers 108 comprise silicon germanium (SiGe) layers and are epitaxially grown with a 25% concentration of germanium (Ge). However, other concentrations of germanium are applicable as well. In one embodiment, the sacrificial layers 108 of the nFET device stack 104 are epitaxially grown with a different thickness than the sacrificial layers 108 of the pFET device stack 106. For example, the sacrificial layers 108 of the pFET device stack 106 may have a thickness $t_p$ (e.g., 15 nm) that is greater than the thickness $t_n$ (e.g., 9 nm) of the sacrificial layers 108 in the nFET device stack 104. It should be noted that embodiments of the present invention are not limited to sacrificial layer thickness of 9 nm and 15 nm as other thicknesses and deltas/ratios between thicknesses are applicable as well. As will be discussed in greater detail below, the difference in thicknesses between the nFET and pFET sacrificial layers 108 allows for the formation of different work function metals for the nFET and pFET devices without masking. The stacks 104, 106 further comprise nanosheets 110 comprising, for example, silicon (Si). Each nanosheet 110 may be epitaxially grown on and in contact with a top surface of an underlying sacrificial layer 110.

The insulating layers 112, in one embodiment, isolate the nFET and pFET devices 104, 106 from each other. In one embodiment, a first insulating layer 112 may be formed on and in contact with the substrate 102 and the nFET device stack 104 may be formed on and in contact with this first insulating layer 112. For example, a first one of the sacrificial layers 108 of the nFET device stack 104 may be formed on and in contact with the first insulating layer 112. A second insulating layer 112 may be formed on and in contact with a top sacrificial layer 108 of the nFET device stack 104. The second insulating layer 112 isolates the pFET device 106 from the nFET device 104. A first one of the sacrificial layers 108 of the pFET device stack 106 may be formed on and in contact with the second insulating layer 112.

The insulation layers 112 may be epitaxially grown with a germanium concentration that is different than the germanium concentration of the sacrificial layers 112. For example, the insulation layers 112 may be a SiGe layer having a germanium concentration of 50%, although other germanium concentrations are applicable as well. The varying concentrations of germanium between the sacrificial layers 108, nanosheet layers 110, and insulating layers 112 may be achieved by varying the epitaxial growth parameters (e.g., concentrations, time, temperature, etc.) for the layers.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 2:
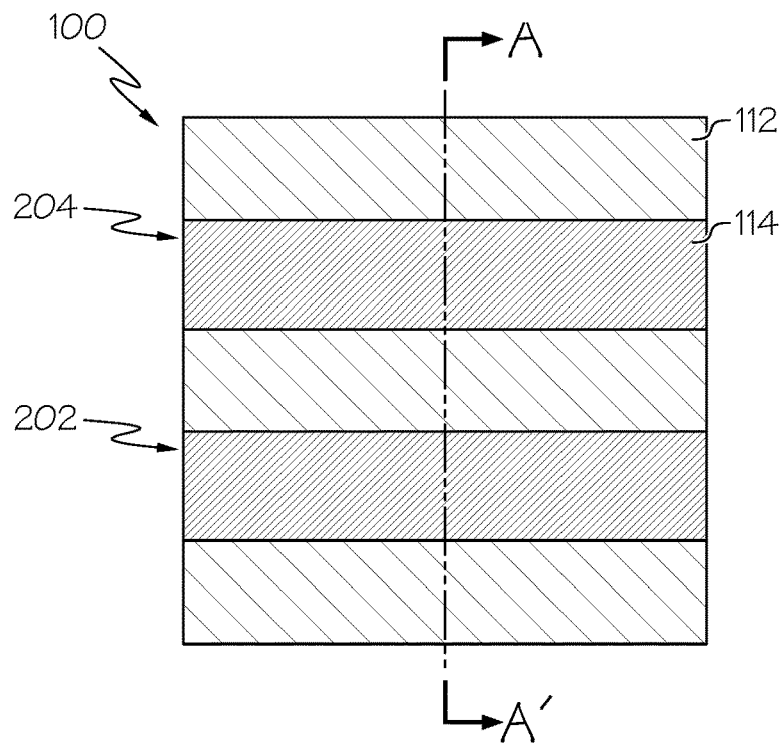
FIG. 2 is a planar view of the semiconductor structure after nanosheet stacks have been patterned according one example of the present invention.
Figure 2A:
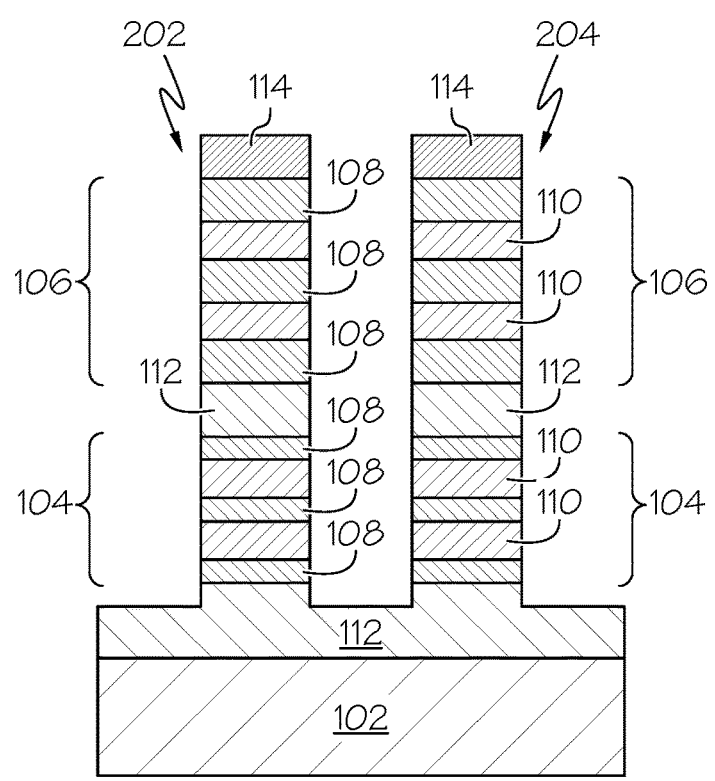
FIG. 2A is a view of the structure shown in FIG. 2 taken transverse to the long axis of the nanosheet stacks according one example of the present invention.

FIGS. 1-1B further show that a hardmask layer 114 may be formed on and in contact with a top layer of the pFET device stack 106. In this example, the top layer is one of the sacrificial layers 112 of the stack. The hardmask layer 114 may comprise a material such as (but not limited to) silicon nitride, silicon oxide, or a dielectric metal oxide, and may be formed by chemical vapor deposition (CVD) or other applicable process. FIGS. 2 and 2A show that sacrificial layers 108, nanosheet layers 110, insulating layers 112, and hardmask layer 114 are patterned to form a plurality of vertical stacks (nanosheet stacks) 202, 204 each comprising a nFET device stack 104 and a pFET device stack 106 isolated from each other by the patterned insulating layer 112. FIG. 2A further shows that exposed portions of the bottom insulating layer 112 may be recessed.

In one embodiment, the vertical stacks 202, 204 may be formed by applying a photoresist layer (not shown) over the hardmask layer 114 and lithographically patterning the photoresist layer to cover one or more contiguous areas. The shape of the contiguous area(s) covered by the patterned photoresist layer may be selected to include an elongated region having a same width and two end portions having a greater width than the elongated region. The pattern in the photoresist layer(s) may be transferred through the alternating stack by an anisotropic etch. A remaining portion(s) of the stack of the sacrificial layers 108, nanosheet layers 110, insulating layer 112, and hardmask layer 114 constitute the vertical stacks 202, 204. Besides the lithography patterning, other patterning techniques such as sidewall imaging transfer, multiple patterning, or the combination of those techniques can be used to pattern the layers.

Figure 3:
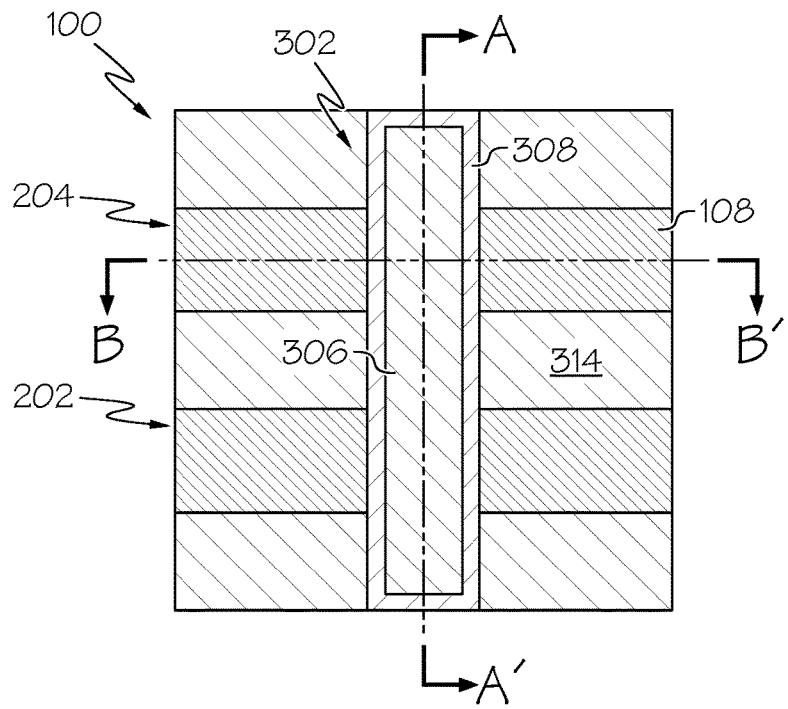
FIG. 3 is a planar view of the semiconductor structure after a disposable gate structure have been formed according one example of the present invention.
Figures 3A, 3B:
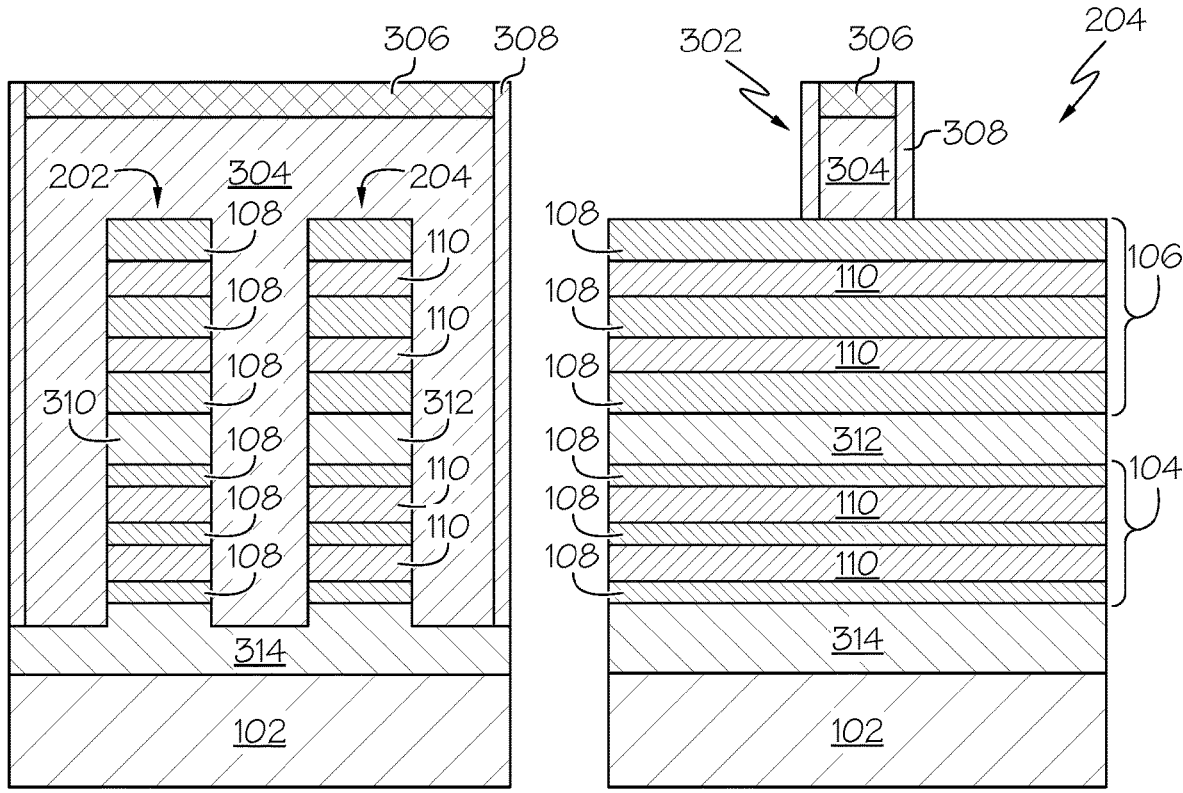
FIG. 3A is a view of the structure shown in FIG. 3 taken transverse to the long axis of the nanosheet stacks according one example of the present invention.
FIG. 3B is a cross-section view of the structure shown in FIG. 3 taken along a line that passes through a nanosheet stack according one example of the present invention.

FIGS. 3 to 3B show that after the vertical stacks 202, 204 have been formed the hardmask layer 114 on top of each vertical stack 202, 204 is removed via one or more stripping processes. This exposes the top surface of the top sacrificial layer 112 of the pFET device stack 106. One or more dummy/disposable gate structures 302 are then formed over and across (wrapping) portions of the vertical stacks 202, 204 that will serve as a channel region(s) of the device(s). In one embodiment, the disposable gate structure(s) may include a disposable gate portion 304 and a disposable gate cap 306. In some embodiments, an etch stop layer (not shown) may be formed on the vertical stacks 202, 204 prior to forming the disposable gate structures 302, 304. The disposable gate structures may then be formed on and in contact with the etch stop layer.

In one embodiment, the disposable gate portion 304 may include a dielectric material. For example, the disposable gate portion 304 may include amorphous carbon, amorphous silicon, diamond-like carbon (DLC), a dielectric metal oxide, silicon nitride, or an organosilicate glass. Alternatively, the disposable gate portion 304 may include a stack of a disposable material liner (not shown) and a disposable gate material portion (not shown). In this case, the disposable material liner may include a dielectric material such as silicon oxide. The disposable gate material portion, in one embodiment, may include a dielectric material, a semiconductor material, or a conductive material, provided that the disposable gate material portion can be removed selective to the dielectric materials of a planarization dielectric layer and a gate spacer to be subsequently formed. The disposable gate cap 306 may include a material such as silicon nitride and may be a bi-layer cap (e.g., nitride-oxide) or tri-layer cap (e.g., oxide-nitride-oxide). The disposable gate structure 302 in one embodiment, may be formed by deposition and patterning of at least one material layer. The patterning of the at least one material layer may be performed by a combination of lithographic methods and an anisotropic etch.

FIGS. 3-3B further show that a gate spacer 308 may be formed around (wrapping) the disposable gate structure 302. In one embodiment, the gate spacer 308 may be formed by depositing a conformal dielectric material layer on the disposable gate structure 302 and the vertical stacks 202, 204 and anisotropically etching the conformal dielectric material layer. The conformal dielectric material layer may include a dielectric material that is different from the material of the disposable gate portions. For example, the conformal dielectric material layer may include silicon nitride, silicon oxide, and/or dielectric metal oxide. An anisotropic etch process may be employed to anisotropically etch horizontal portions of the conformal dielectric material layer. Further, vertical portions of the conformal dielectric material layer may be recessed below a top surface of the disposable gate cap 306.

After the dummy gate structure 302 and spacer 308 have been formed, the insulating layers 112 may be removed selective to the remaining layers of the stacks 202, 204 and the resulting cavities may be backfilled with a dielectric material to form isolation layers 310 to 314. For example, a wet etch process or a dry etch process can be utilized to selectively remove the insulating layers 112. The vertical stacks 202, 204 are anchored by dummy gate structure 302 and spacer 308 during the removal of the insulating layers 112 and dielectric back fill/recess.

Figure 4:
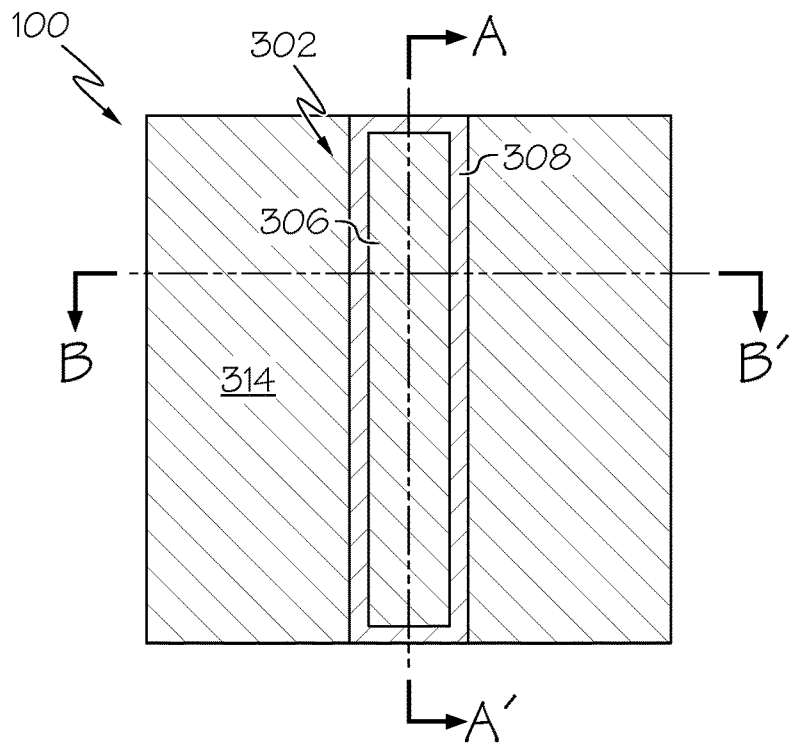
FIG. 4 is a planar view of the semiconductor structure after portions of the nanosheets stacks have been etched/recessed for formation of source/drains according one example of the present invention.
Figure 4A:
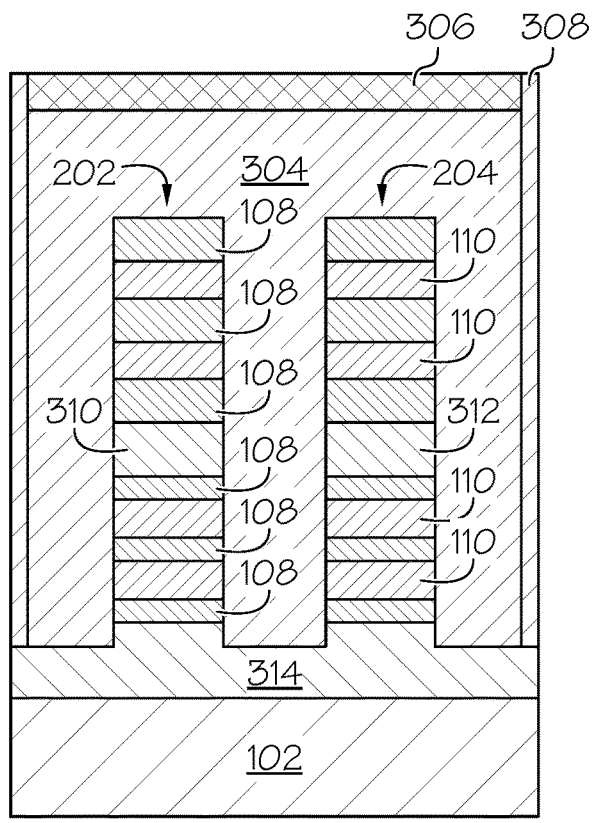
FIG. 4A is a view of the structure shown in FIG. 4 taken transverse to the long axis of the nanosheet stacks according one example of the present invention.
Figure 4B:
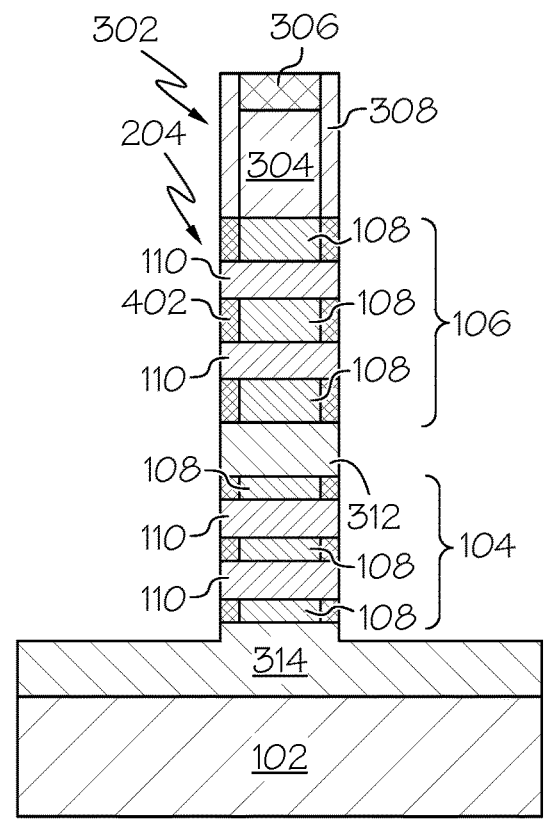
FIG. 4B is a cross-section view of the structure shown in FIG. 4 taken along a line that passes through a nanosheet stack according one example of the present invention.

FIGS. 4-4B show that exposed portions of the vertical stacks 202, 204, which do not underlie the dummy gate structure 302 and spacer 308, are removed or recessed. These portions of the vertical stacks 202, 204 are disposed within the source/drain regions of the device. In one embodiment, a directional etching process such as a reactive-ion-etching (ME) process may be utilized to remove the exposed portions of the vertical stacks 202, 204. The etching process exposes one or more of a portion of the top surface of the bottom isolation layer 314; ends of the sacrificial layers 108; ends of the nanosheet layers 108; and ends of the bottom isolation layer 314.

FIG. 4B further shows that inner spacers 402 are formed in contact with sidewalls/ends of the sacrificial layers 108. In one embodiment, the inner spacers 402 are formed by removing a portion of the sacrificial layers 108 to reduce the size of the sacrificial layers 108 in at least one lateral dimension (i.e., length, width). The portion of the sacrificial layers 108 may be removed using an isotropic etch (e.g., wet chemical etch, dry plasma etch, gas phase etch, etc.), where the isotropic etch etches laterally into the sacrificial layers 108. The isotropic etch may remove a predetermined amount of material from the sacrificial layers 108, where the etch may be a timed etch to uniformly remove an equal amount of material from each exposed end. The isotropic etch may form indentations having a predetermined indentation depth into the sacrificial layers. After the etching process, the nanosheet layers 110 may extend passed the sacrificial layers 108 by a predetermined distance. Each of the indentations may extend into the area below the disposable gate spacer 308.

A deposition process such as atomic layer deposition (ALD), plasma enhanced atomic layer deposition (PEALD), chemical vapor deposition (CVD), plasma enhanced chemical vapor deposition (PECVD), or combinations thereof, is performed to conformally deposit the inner spacer material which pinches off within the indentations and form the inner spacers 402. Portions of the inner spacers 402 that extend out beyond the disposable gate spacer 308 may be removed, for example, by an etch back process (e.g., wet etch). In one or more embodiments, the inner spacers 402 may comprise silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

A selective epitaxy process is then performed to form a first source/drain layer 502 at the ends of all the nanosheet layers 110 including both the nFET nanosheet layers and the pFET nanosheet layers, as shown in FIGS. 5 to 5B. In one embodiment, the ends of the sacrificial layers 108 and/or the ends of the nanosheet layers 110 of the vertical stacks 202, 204 may be used as seeds for the epitaxy process. During the selective epitaxy process, a semiconductor material is deposited only on semiconductor surfaces, and does not nucleate on dielectric surfaces. A source portion 504 of the layer 502 may grow from surfaces of the sacrificial layers 108 and/or the nanosheet layers 110 located on one side of the disposable gate structure 302. A drain portion 506 of the layer 502 may grow from surfaces of the sacrificial layers 108 and/or the nanosheet layers 110 located on the other side of the disposable gate structure 302. In one embodiment, the first source/drain layer 502 may be a phosphorous doped silicon (Si:P) layer. In other embodiments, the first source/drain layer 502 may comprise other materials such as (but not limited to) silicon, silicon germanium, germanium, carbon and phosphorous doped silicon (Si:CP), arsenic doped silicon (Si:As), any suitable combination of these or other materials, and/or the like.

Each of the source and drain portions 504, 506 may be a single crystalline, and may be epitaxially aligned to the single crystalline structure of the vertical stack of the sacrificial layers 108 and/or the nanosheet layers 110. The source and drain portions 504, 506 may be formed with in-situ doping of the electrical dopants, or by deposition of an intrinsic semiconductor material (e.g., Si, SiGe, or Ge), and subsequent introduction of electrical dopants by ion implantation, plasma doping, gas phase doping, or out-diffusion from a disposable doped silicate glass layer. The first source/drain layer 502 may then be recessed down to the isolation layer 310 disposed between the nFET device 104 and the pFET device 106. This isolation layer 310 provides process margin for recess control.

Figure 6:
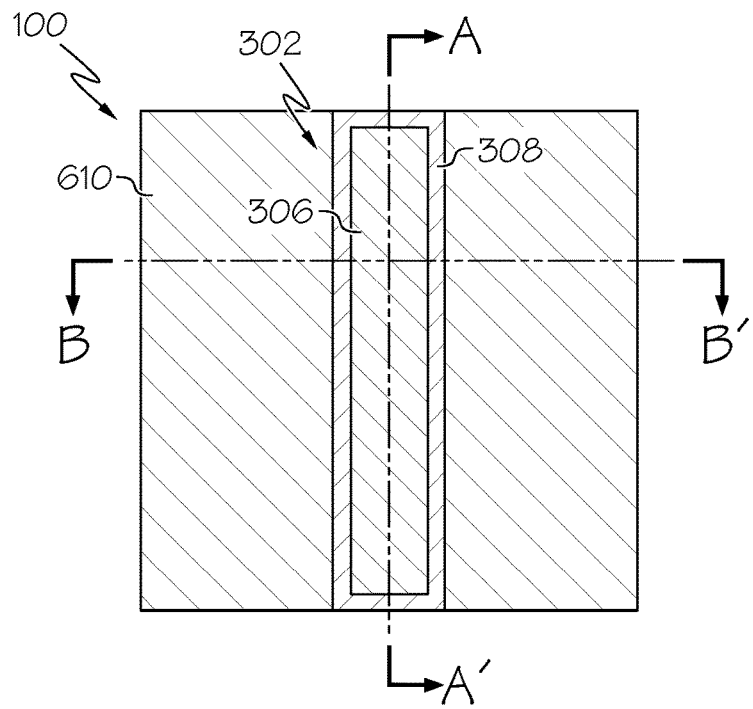
FIG. 6 is a planar view of the semiconductor structure after source/drains have been formed for the pFET device according one example of the present invention.
Figure 6A:
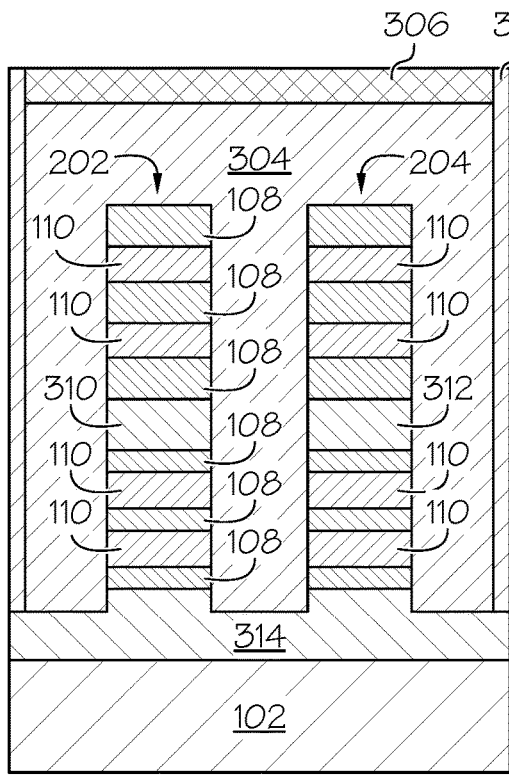
FIG. 6A is a view of the structure shown in FIG. 6 taken transverse to the long axis of the nanosheet stacks according one example of the present invention.
Figure 6B:
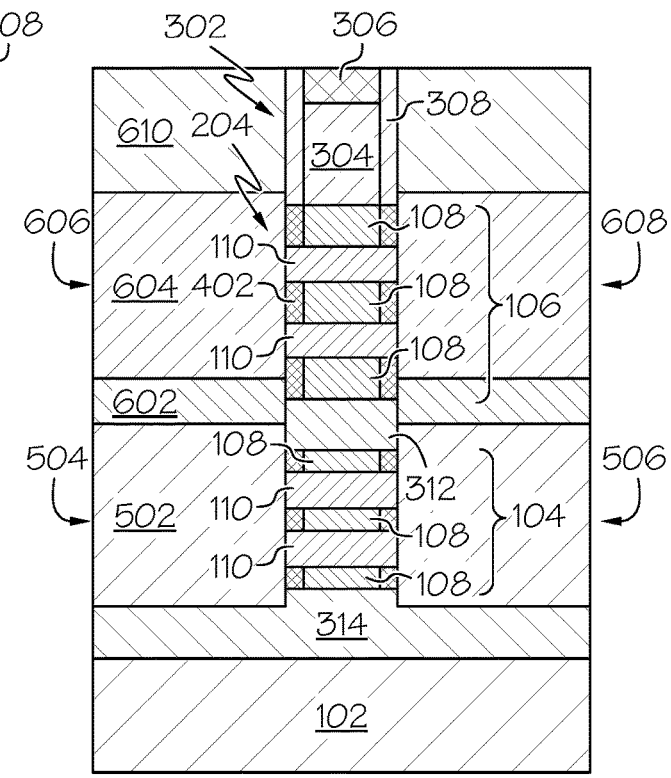
FIG. 6B is a cross-section view of the structure shown in FIG. 6 taken along a line that passes through a nanosheet stack according one example of the present invention.

FIGS. 6-6B show that a dielectric layer 602 comprising, for example, an oxide may be formed on and in contact with a top surface of the first source/drain layer 502 and at least a portion of the sidewalls of the isolation layer 310 disposed between the nFET device 104 and the pFET device 106. and at least a portion of the sidewalls of the inner spacer 402 formed in contact with the bottom most sacrificial layer 108 of the pFET device stack 106. The dielectric layer 602 may be formed by, for example, directional high density plasma (HDP) oxide deposition or other applicable process.

A selective epitaxy process is then performed to form a second source/drain layer 604 at the ends of all the nanosheet layers 110 of the pFET device stack 106. The second source/drain layer 604 may be formed similar to the first source/drain layer 502 discussed above with respect to FIGS. 5 to 5B. A source portion 606 of the layer 604 may grow from surfaces of the sacrificial layers 108 and/or the nanosheet layers 110 located on one side of the disposable gate structure 302. A drain portion 608 of the layer 604 may grow from surfaces of the sacrificial layers 108 and/or the nanosheet layers 110 located on the other side of the disposable gate structure 302. In one embodiment, the second source/drain layer 604 may be a boron doped silicon germanium (SiGe:B) layer. In other embodiment, the source/drain layer 604 may comprise other materials such as (but not limited to) silicon, silicon germanium, germanium, boron doped silicon (Si:B), boron doped germanium (Ge:B), any suitable combination of these or other materials, and/or the like. The pFET source and drain portions 606, 608 may be formed with in-situ doping of the electrical dopants, or by deposition of an intrinsic semiconductor material and subsequent introduction of electrical dopants by ion implantation, plasma doping, gas phase doping, or out-diffusion from a disposable doped silicate glass layer. The second source/drain layer 604 may be grown or recessed to a height that is at least equal to or above a bottom surface of the gate spacer 308.

FIGS. 6 and 6A further show that an inter-layer dielectric (ILD) layer 610 is deposited over the structure 100. A planarization process may be performed to planarize the ILD 610 down to be coplanar with a top of the disposable gate structure 302. The planarization process may include a chemical mechanical polishing (CMP) process. The ILD layer 610 may comprise silicon oxide, silicon nitride, oxynitride, or other suitable materials.

Figure 7:
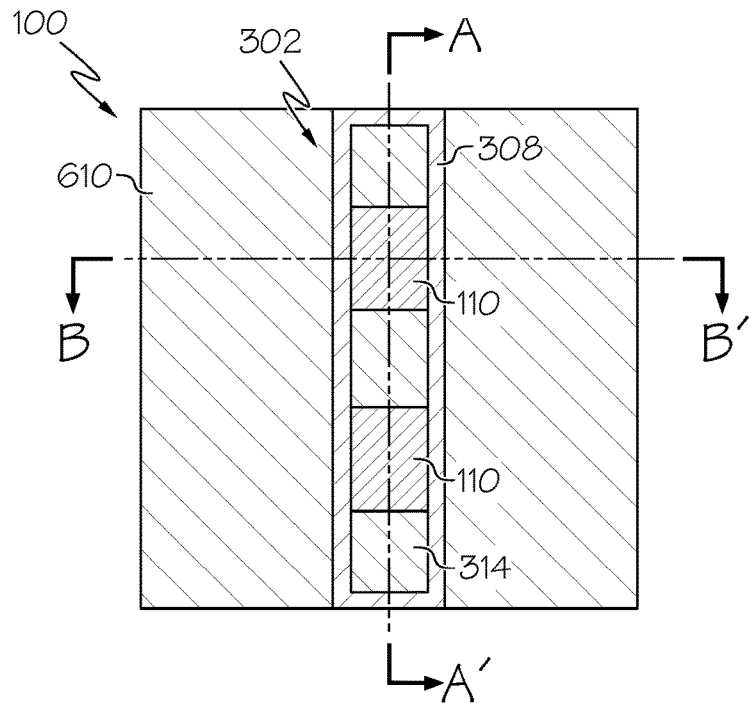
FIG. 7 is a planar view of the semiconductor structure after the disposable gate structures and sacrificial layers of the nanosheet stacks have been removed according one example of the present invention.
Figures 7A, 7B:
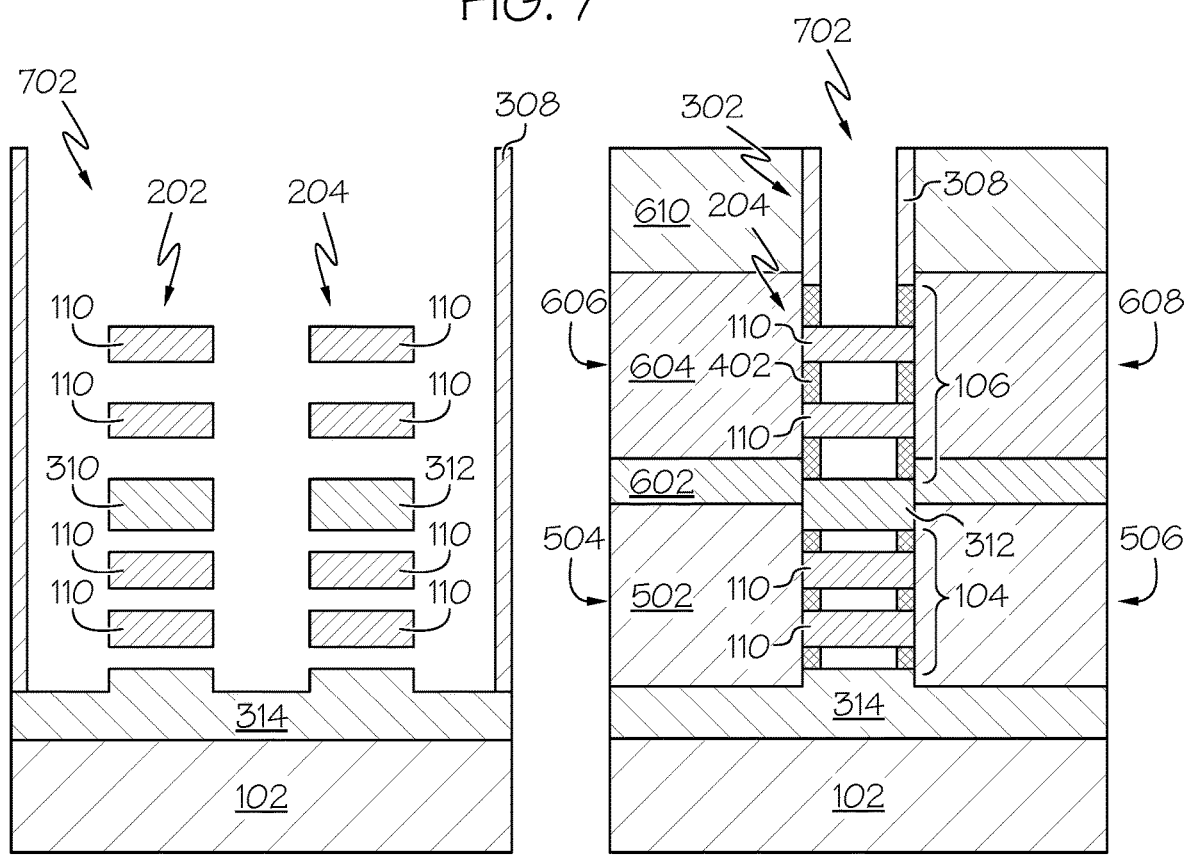
FIG. 7A is a view of the structure shown in FIG. 7 taken transverse to the long axis of the nanosheet stacks according one example of the present invention.
FIG. 7B is a cross-section view of the structure shown in FIG. 7 taken along a line that passes through a nanosheet stack according one example of the present invention.

FIGS. 7-7B show that the disposable gate cap 306 is stripped and the disposable gate structure 302 is selectively removed via selective etching. The selective etching process may include, for example, an isotropic etch and/or an anisotropic etch. A gate cavity 702 may be formed in the volume from which the disposable gate structure 302 was removed. A portion of the top surface of the pFET device stack 106 is exposed within each gate cavity 702. Inner sidewall surfaces the spacer 308 and the top/upper inner spacer 402 of the pFET device stack 106 are also exposed within the gate cavity 702.

Figure 8:
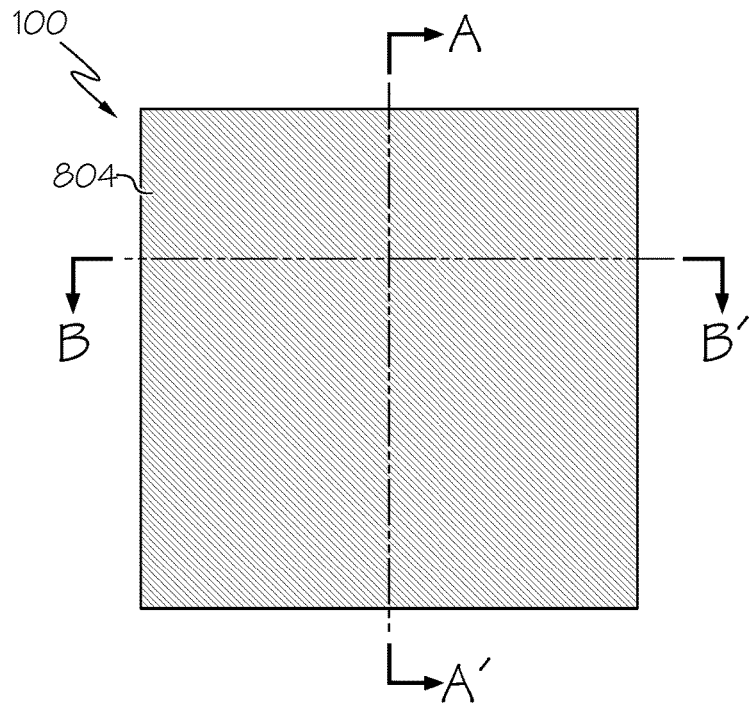
FIG. 8 is a planar view of the semiconductor structure after a gate dielectric layer and a nFET work function layer have been conformally formed over the structure according one example of the present invention.
Figure 8A:
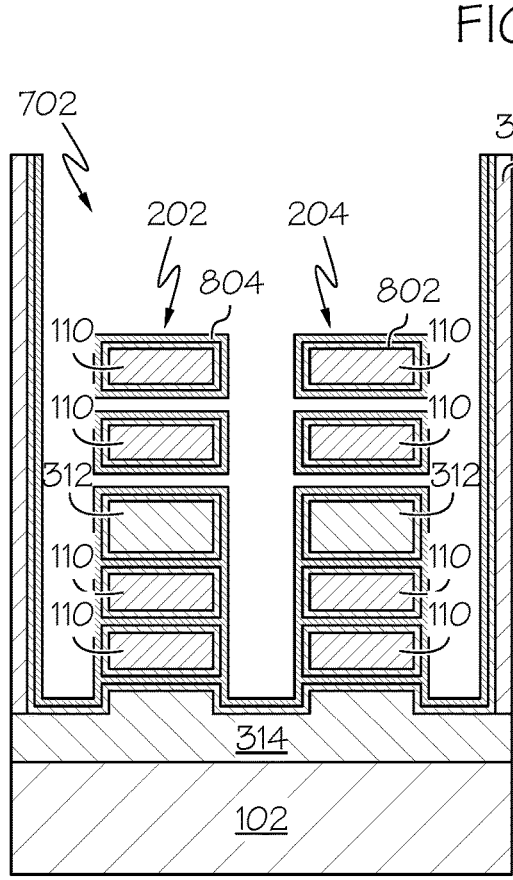
FIG. 8A is a view of the structure shown in FIG. 8 taken transverse to the long axis of the nanosheet stacks according one example of the present invention.
Figure 8B:
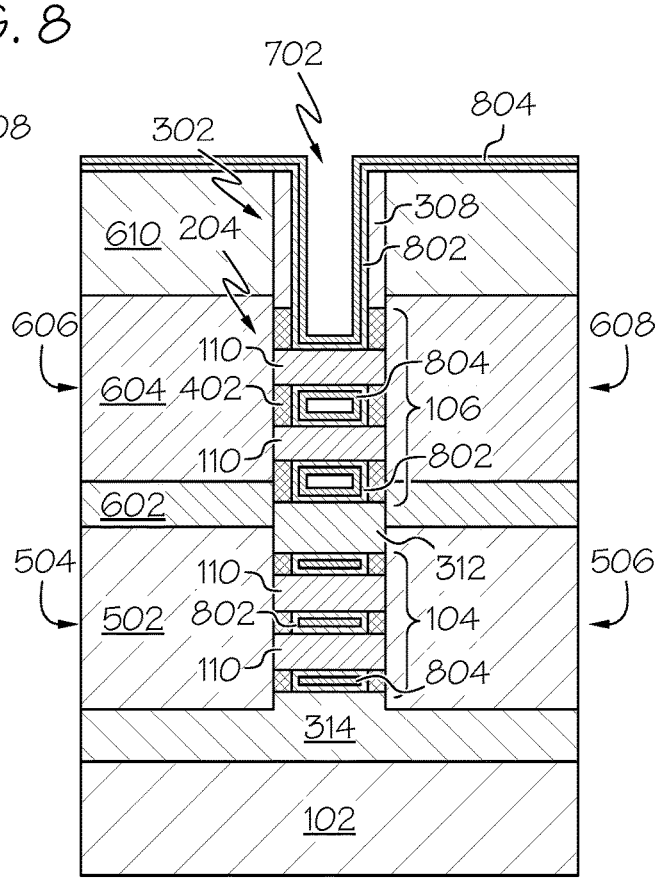
FIG. 8B is a cross-section view of the structure shown in FIG. 8 taken along a line that passes through a nanosheet stack according one example of the present invention.

FIGS. 7-7B further show that a selective etching process is performed to remove the sacrificial layers 108 selective to the nanosheet layers 110 of each vertical stack 202, 204. For example, a wet etch process, a dry plasma etch, or a gas phase etch process can be utilized to selectively remove the sacrificial layers 108 of the vertical stacks 202, 204. This process forms cavities 704 between each of the nFET and pFET nanosheet layers 110 of the vertical stacks 202, 204, which are anchored by the epitaxy material of the source/drain layers 502, 604. In one embodiment, the sacrificial layers 108 comprise silicon germanium that may be removed by gas phase hydrofluoride (HCl) selective to silicon and dielectric materials FIGS. 8-8B show that a gate dielectric layer 802 may be formed in contact with and surrounding/wrapping the nanosheet layers 110 of both the nFET and pFET device stacks 104, 106 and the isolation layer(s) 310 separating the nFET and pFET device stacks 104, 106. The dielectric layer 802 separates the nanosheet channels from a subsequently formed work function layer/gate electrode. The gate dielectric layer 802 may also formed on and in contact with a top surface and sidewalls of the bottom isolation layer(s) 314; the inner sidewall surfaces the spacer 308; and the top/upper inner spacer 402 of the pFET device stack 106; a top surface of the spacer 308; and a top surface of the ILD 610. The dielectric layer may be formed/depositing by a conformal deposition process such as ALD.

By way of example, in the case of a metal gate, a suitable gate dielectric may be an insulating dielectric layer, for example, a silicon oxide (SiO), silicon nitride (SiN), silicon oxynitride (SiON), a high-K dielectric, or a suitable combination of these materials. The term "high-κ" as used herein refers to a material having a relative dielectric constant κ which is much higher than that of silicon dioxide (e.g., a dielectric constant κ=25 for hafnium oxide rather than 4 for silicon dioxide. High-K dielectric materials may include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also applicable as well. The stoichiometry of the high-K compounds can vary.

A nFET work function layer 804 may then be formed on and in contact with the gate dielectric layer 802. The nFET work function layer 804 may be formed, for example, by conformally depositing a nFET work function metal on and in contact with the gate dielectric layer 802 using a process such as ALD. The nFET work function layer 804 may be formed in contact with and surrounding/wrapping the gate dielectric layer 802 encompassing the nanosheet layers 110 of the nFET device stack 104; the nanosheet layers 110 of the pFET device stack 106; and the isolation layer(s) 310 separating the nFET and pFET device stacks 104, 106. In one example, the nFET work function layer 804 has a thickness (e.g., 3 nm) such that the narrower nanosheet layers 110 in the nFET device stack 104 are pinched off while the wider nanosheet layers 110 in the pFET device stack 106 are not pinched off. The non-pinched-off nanosheet layers 110 in the pFET device stack 106 allows for the nFET work function layer 804 to be subsequently removed from the pFET device stack 106.

Figure 9:
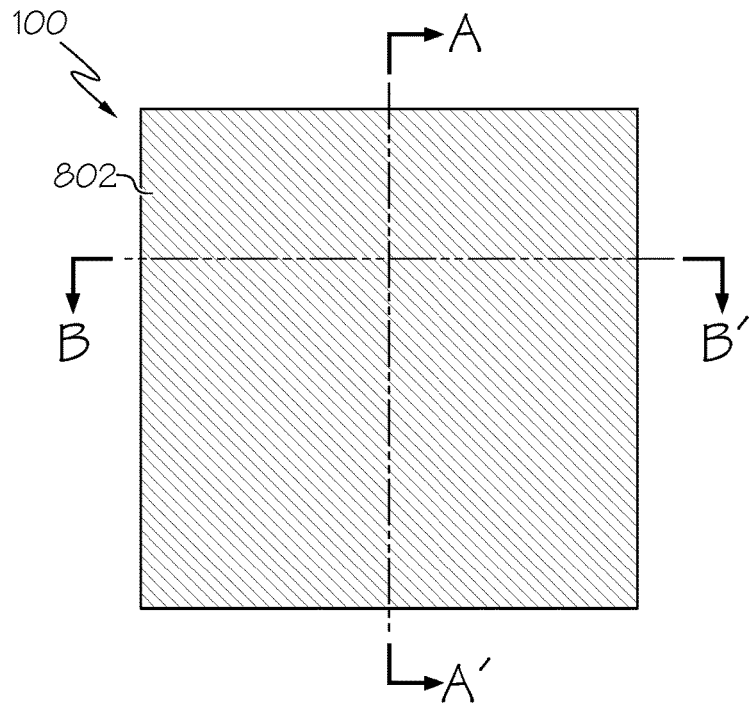
FIG. 9 is a planar view of the semiconductor structure after the nFET work function layer have been removed from the structure except for the portions of the nFET work function layer on the nFET device stack according one example of the present invention.
Figures 9A, 9B:
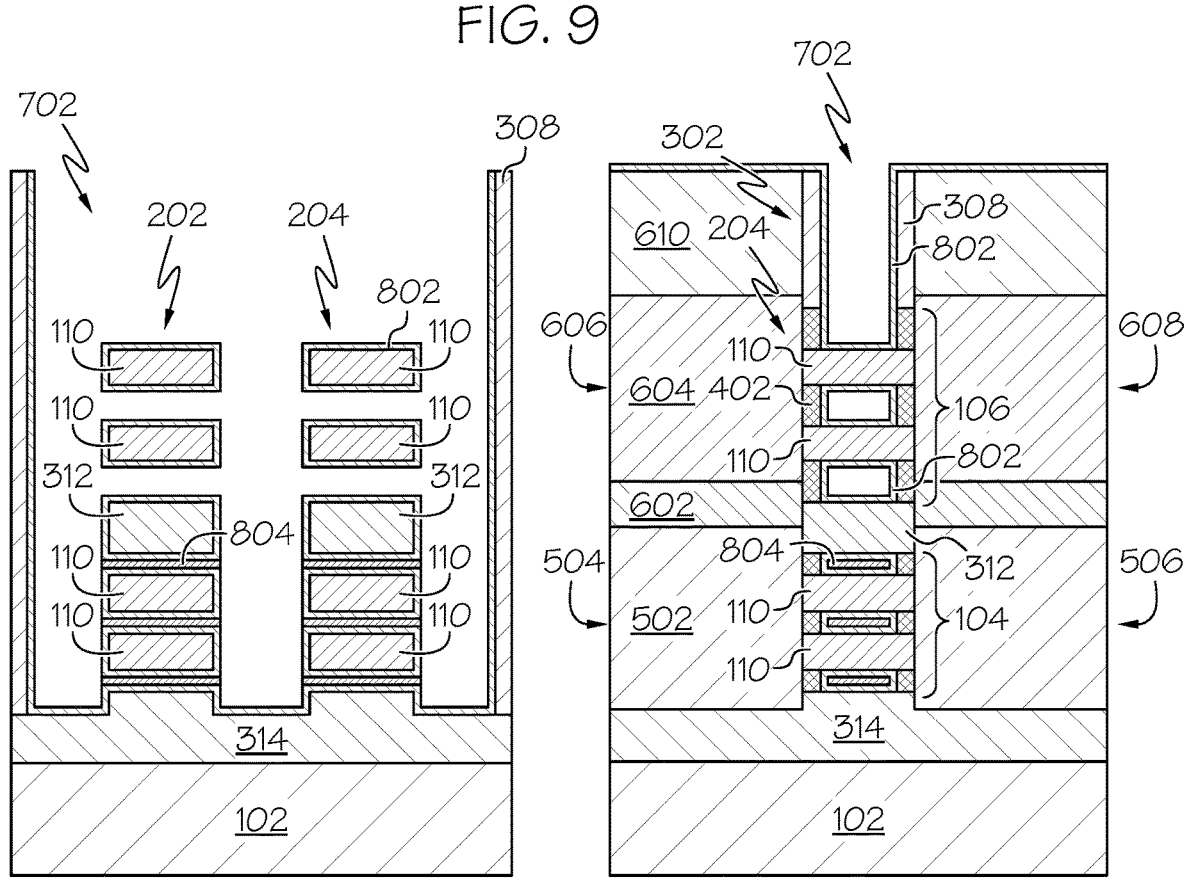
FIG. 9A is a view of the structure shown in FIG. 9 taken transverse to the long axis of the nanosheet stacks according one example of the present invention.
FIG. 9B is a cross-section view of the structure shown in FIG. 9 taken along a line that passes through a nanosheet stack according one example of the present invention.

FIGS. 9-9B show that after the nFET work function layer 804 has been formed, portions of the nFET work function layer 804 on the pFET device stack 106 are removed while the portions of the nFET work function layer 804 formed on the nFET device stack 104 are maintained. The removal of the nFET work function layer 804 from the pFET device stack 106 may be achieved without masking the nFET device stack 104. This can be accomplished because the nFET work function layer 804 formed on the pFET device stack 106 is not pinched off between the pFET nanosheet layers 110. A timed etch may be used to remove the nFET work function layer 804 from the pFET device stack 106. For example, a timed etch of 4 nm nFET work function material completely removes a 3 nm work function layer from the pFET device stack 106. The work function layer 804 formed on the nFET device stack 104 remains between the nFET nanosheet layers 110 since it is completely pinched off between these layers 110. This process further removes the nFET work function layer 804 from the portions of the cavity 702 above the pFET device stack 106; the top surface of the dielectric layer 802; inner sidewalls of the spacer 308; portions of the top surface of the bottom isolation layer 314 not underlying the nFET nanosheet layers 110; and sidewalls of the bottom isolation layer 314.

Figure 10:
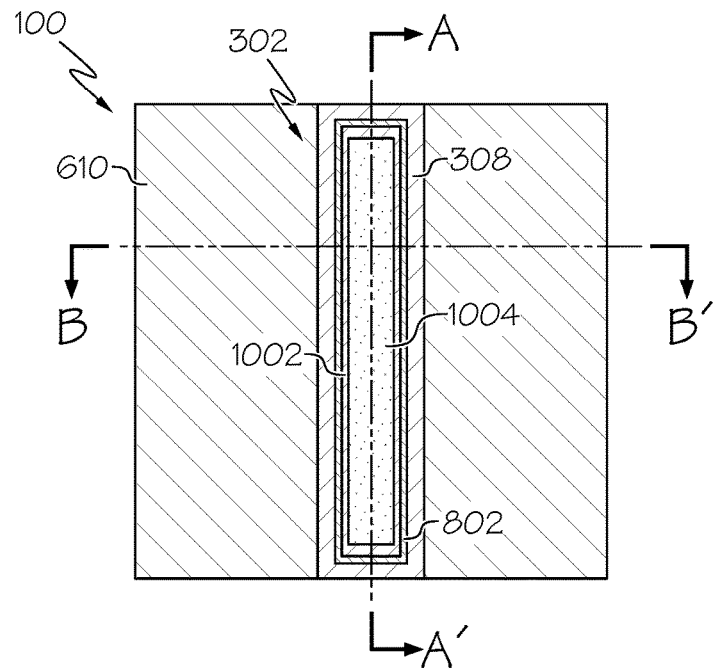
FIG. 10 is a planar view of the semiconductor structure after a pFET work function layer and a conductive gate electro have been formed according one example of the present invention.
Figures 10A, 10B:
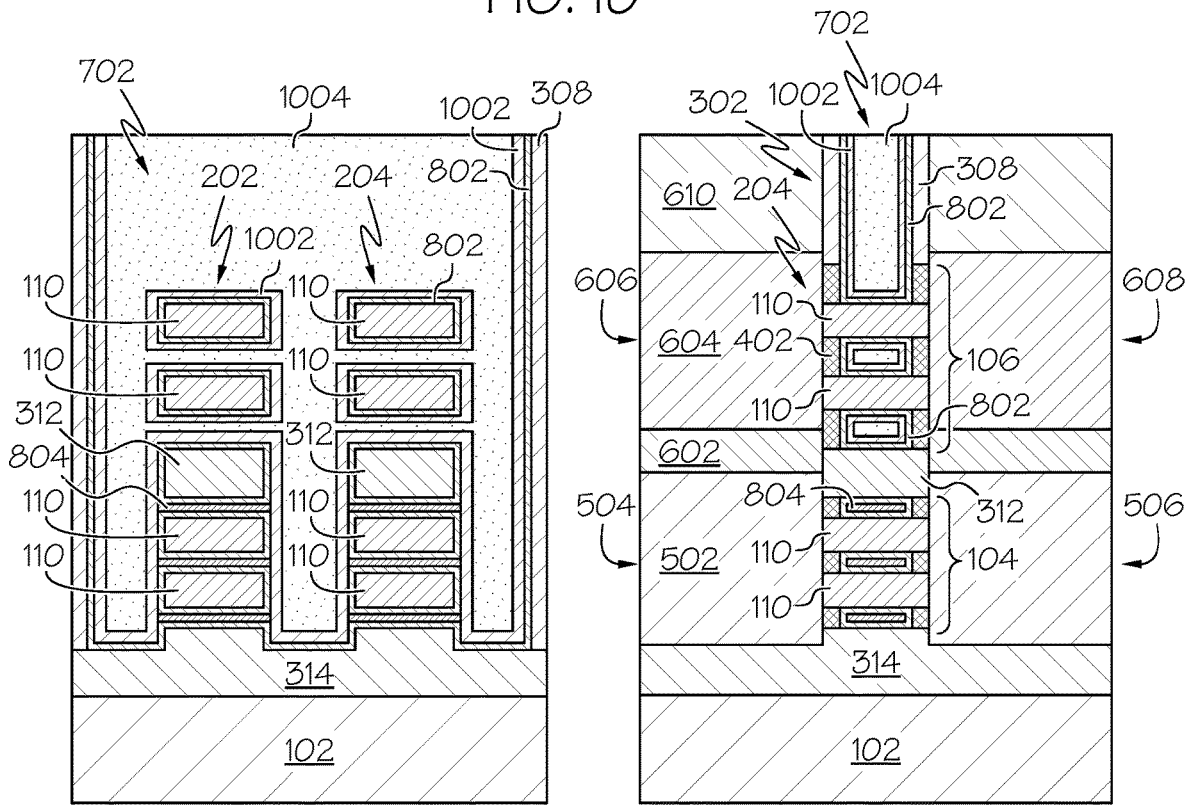
FIG. 10A is a view of the structure shown in FIG. 10 taken transverse to the long axis of the nanosheet stacks according one example of the present invention.
FIG. 10B is a cross-section view of the structure shown in FIG. 10 taken along a line that passes through a nanosheet stack according one example of the present invention.

FIGS. 10-10B show that after portions nFET work function layer 804 have been removed from the pFET device stack 106, a pFET work function layer 1002 may be formed. The pFET work function layer 1002 may be formed by, for example, conformally depositing a pFET work function metal on and in contact with the gate dielectric layer 802 using a process such as ALD. In one embodiment, the pFET work function layer 1002 comprises a different material(s) than the nFET work function layer 804 As shown in FIGS. 10A and 10B, the pFET work function layer 1002 may contact and surrounding the gate dielectric layer 802 encompassing the nanosheet layers 110 of the pFET device stack 106. However, in this example, the pFET work function layer 1002 does not surround the nanosheet layers 110 of the nFET device stack 104 since they are pinched off by the nFET work function layer 804.

In various embodiments, the work function layers 804, 1002 may be any suitable material, including but not limited a nitride, such as (but not limited to) titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof; and/or the like. The gate conductor and WFM may be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The work function layer may include multiple layers of work function materials, for example, a work function layer can be a TiN/TiC stack. In various embodiments, the work function layer may have a thickness in the range of about 3 nm to about 11 nm, or can have a thickness in the range of about 5 nm to about 8 nm.

After the pFET work function layer 1002 has been formed an optional metal fill process may be performed to form a conductive gate electrode 1004. This process fills the gate cavity 702 and any cavities between the nanosheet layers 110 with a conductive gate electrode material(s). In some embodiments the metal fill process is optional may be performed when there is still spacing left between adjacent nanosheets after gate dielectric and work function metal deposition. By way of example only, in the case of a metal gate, a combination of gate metals may be used that constitute the gate conductor 1004.

The gate conductor 1004 may comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, any suitable combination of these materials, and/or the like. The conductive material may further comprise dopants that are incorporated during or after deposition. The resulting gate structure may be referred to a gate-all-around (GAA) configuration since the gate surrounds/wraps one or more of the nanosheet layers 110. A planarization process such as CMP may be performed to planarize and remove excess dielectric and gate electrode material from the top surface of the structure 100.

Figure 11:
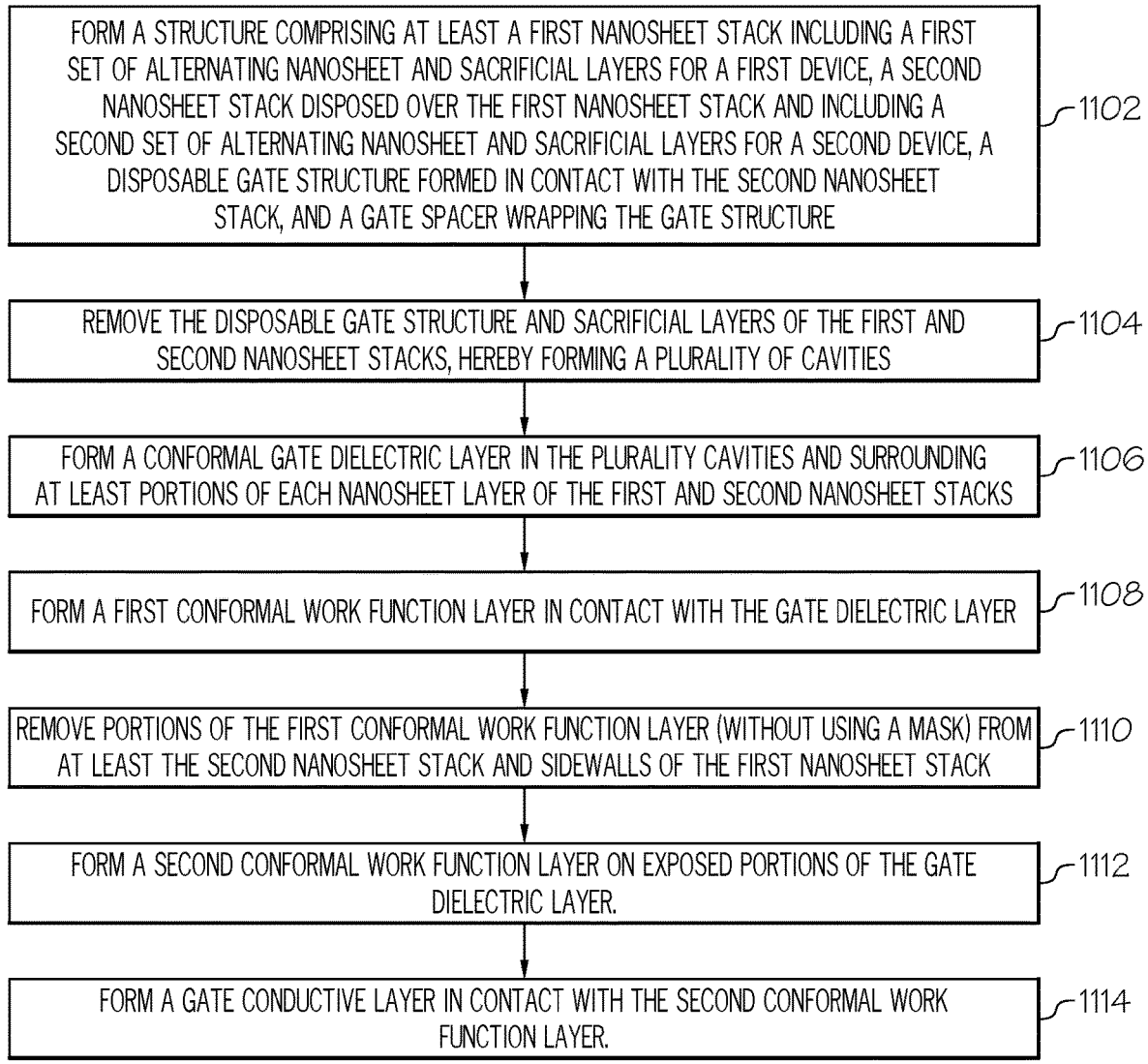
FIG. 11 is an operational flow diagram illustrating one example of a process for forming a semiconductor device according one embodiment of the present invention.

FIG. 11 is an operational flow diagram illustrating one example of a process for forming a vertical stacked nanosheet CMOS transistor with different work function metals according one example of the present invention. It should be noted that each of the steps shown in FIG. 11 has been discussed in greater detail above with respect to FIGS. 1-10B. A structure, at step 1102, is formed. The structure comprises at least a first nanosheet stack including a first set of alternating nanosheet and sacrificial layers for a first device (e.g., a device of a first doping type such as nFET), a second nanosheet stack disposed over the first nanosheet stack and including a second set of alternating nanosheet and sacrificial layers for a second device (e.g., a device of a second doping type such as pFET), a disposable gate structure formed in contact with the second nanosheet stack, and a gate spacer wrapping the gate structure. The disposable gate structure and sacrificial layers of the first and second nanosheet stacks, at step 1104, are removed thereby forming a plurality of cavities.

A conformal gate dielectric layer, at step 1106, is formed in the plurality cavities and surrounding at least portions of each nanosheet layer of the first and second nanosheet stacks. A first conformal work function layer, at step 1108, is formed in contact with the gate dielectric layer. Portions of the first conformal work function layer, at step 1110, are removed (without using a mask) from at least the second nanosheet stack and sidewalls of the first nanosheet stack. A second conformal work function layer, at step 1112, is formed on exposed portions of the gate dielectric layer. A gate conductive layer, at step 1114, is formed in contact with the second conformal work function layer.

Figure 12:
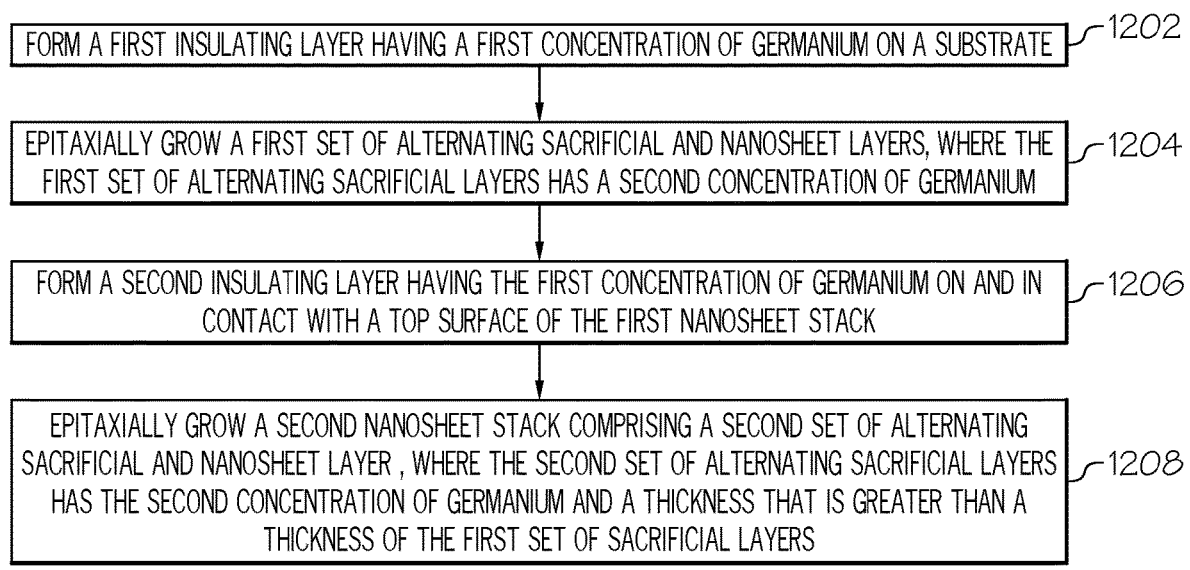
FIG. 12 is an operational flow diagram illustrating one example of a process for forming a semiconductor structure according one embodiment of the present invention.

FIG. 12 is an operational flow diagram illustrating one example of a process for forming a semiconductor structure for fabricating vertical stacked nanosheet CMOS transistor with different work function metals according one example of the present invention. A first insulating layer having a first concentration of germanium, at step 1202, is formed on a substrate. A first set of alternating sacrificial and nanosheet layers, at step 1204, is epitaxially grown. The first set of alternating sacrificial layers has a second concentration of germanium. A second insulating layer having the first concentration of germanium, at step 1206, is formed on and in contact with a top surface of the first nanosheet stack. A second nanosheet stack comprising a second set of alternating sacrificial and nanosheet layers, at step 1208, is epitaxially grown. The second set of alternating sacrificial layers has the second concentration of germanium and a thickness that is greater than a thickness of the first set of sacrificial layers.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A semiconductor device comprising at least:
   a first nanosheet stack for a first device of a first channel type, wherein the first nanosheet stack includes a plurality of first nanosheet layers, wherein the each of the plurality of first channel layers are spaced apart from each other a first distance;
   a second nanosheet stack for a second device of a second channel type different from the first channel type, wherein the second nanosheet stack includes a plurality of second nanosheet layers, wherein the second nanosheet stack is disposed on top of the first nanosheet stack, wherein each of the plurality of second channel layers are spaced apart a second distance, wherein the first distance is less than the second distance; and
   a gate structure wrapping around the first nanosheet stack and the second nanosheet stack, wherein the gate structure comprises
      a gate dielectric layer surrounding a first set of nanosheet layers of the first nanosheet stack and a second set of nanosheet layers of the second nanosheet stack;
      a first work function layer is located between two different portions of the gate dielectric layer located in the first nanosheet stack, wherein the first work function layer is in direct contact with the gate dielectric that surrounds each of the plurality of first nanosheet layers;
      a second work function layer in contact with at least second portion of the gate dielectric layer surrounding the second set of nanosheet layers, wherein the second work function layer is in direct contact with the gate dielectric layer that surrounds the plurality of second channel layers, wherein the first work function layer is not in contact with the gate dielectric layer that surrounds the plurality of second channel layers, wherein a gap exists between portions of the second work function layer between each nanosheet layer of the second set of nanosheet layers; and
      a gate conductor layer formed in contact with the second work function layer, wherein the gate conductor layer fills the gap between the portions of the second work function layer.

2. The semiconductor device of claim 1, further comprising:
a first source layer and a first drain layer of the first doping type formed in contact with the first nanosheet stack;
a dielectric layer formed top of and in contact with at least the first source layer and the first drain layer; and
a second source layer and a second drain layer of the second doping type formed in contact with the second nanosheet stack and further formed in contact with a top surface of the dielectric layer.

3. The semiconductor device of claim 1, wherein the first work function layer comprises a different material than the second work function layer.

4. A semiconductor device comprising at least:
a first nanosheet stack for a first device of a first channel type, wherein the first nanosheet stack includes a plurality of first nanosheet layers, wherein the each of the plurality of first channel layers are spaced apart from each other a first distance;
a second nanosheet stack for a second device of a second channel type different from the first channel type, wherein the second nanosheet stack includes a plurality of second nanosheet layers, wherein the second nanosheet stack is disposed on top of the first nanosheet stack, wherein each of the plurality of second channel layers are spaced apart a second distance, wherein the first distance is less than the second distance; and
a gate structure wrapping around the first nanosheet stack and the second nanosheet stack, wherein the gate structure comprises
a gate dielectric layer;
a first work function layer is located between two different portions of the gate dielectric layer located in the first nanosheet stack, wherein the first work function layer is in direct contact with the gate dielectric that surrounds each of the plurality of first nanosheet layers;
a second work function layer in contact with at least second portion of the gate dielectric layer surrounding nanosheet layers of the second nanosheet stack, wherein the second work function layer is in direct contact with the gate dielectric layer that surrounds the plurality of second channel layers, wherein the first work function layer is not in contact with the gate dielectric layer that surrounds the plurality of second channel layers; and
a gate conductor layer formed in contact with the second work function layer.

5. The semiconductor device of claim 4, wherein the first work function layer is pinched off between each nanosheet layer of the plurality of first nanosheet layers.

6. The semiconductor device of claim 4, wherein the gate conductor layer fills a gap between portions of the second work function layer between each of the plurality of second nanosheet layers of the second nanosheet stack.

* * * * *